(12) United States Patent
Teague

(10) Patent No.: US 11,906,754 B2
(45) Date of Patent: Feb. 20, 2024

(54) ULTRA-FAST ELECTRICAL SWITCHING USING OPTICAL PATH LENGTH DIFFERENCES

(71) Applicant: Government of the United States, as represented by the Secretary of the Air Force, Wright-Patterson AFB, OH (US)

(72) Inventor: Joseph D. Teague, Albuquerque, NM (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 291 days.

(21) Appl. No.: 17/647,045

(22) Filed: Jan. 5, 2022

(65) Prior Publication Data

US 2022/0269096 A1 Aug. 25, 2022

Related U.S. Application Data

(63) Continuation-in-part of application No. 17/647,037, filed on Jan. 5, 2022.

(60) Provisional application No. 63/151,877, filed on Feb. 22, 2021.

(51) Int. Cl.
G02B 27/14 (2006.01)
H01L 31/08 (2006.01)

(52) U.S. Cl.
CPC .............. *G02B 27/14* (2013.01); *H01L 31/08* (2013.01)

(58) Field of Classification Search
CPC ................................ G02B 27/14; H01L 31/08
USPC .......................................................... 359/634
See application file for complete search history.

(56) References Cited

U.S. PATENT DOCUMENTS 7,173,295 B1 * 2/2007 Mar ...................... H01L 31/125
257/466

* cited by examiner

*Primary Examiner* — William Choi
(74) *Attorney, Agent, or Firm* — AFMCLO/JAZ; Richard M. Mescher

(57) ABSTRACT

A method for triggering switches in a defined order comprises providing two or more PCSS devices and a compatible optical trigger; projecting a beam from the optical trigger; splitting the optical beam into two or more paths toward the two or more PCSS devices, wherein each of the two or more paths has a different length such that each of the two or more PCSS devices are triggered with defined time differentials. Each of the defined path lengths may be determined with the speed of light from the optical trigger along the two or more paths in order to achieve the desired switch-timing differential. The optical path consists of at least one of an optical fiber, a mirror arrangement, and a lens arrangement. Path lengths may be controlled by different fiber lengths, and transmitting a beam through a solid having a higher index of refraction than other beam path(s).

6 Claims, 3 Drawing Sheets

ULTRA-FAST ELECTRICAL SWITCHING USING OPTICAL PATH LENGTH DIFFERENCES

Pursuant to 37 C.F.R. § 1.78(a)(4), this application claims the benefit of and priority to prior filed Provisional Application Ser. No. 63/151,877, filed 22 Feb. 2021, and prior-filed co-pending NonProvisional application Ser. No. 17/647,037, filed 5 Jan. 2022 which are expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to high-speed switching and, more particularly, to a method of using optical path length differences, to switch photoconductive semiconductor switches (PCSS) at different times from a single optical trigger source with an ultra-high degree of precision.

BACKGROUND OF THE INVENTION

PCSSs require an optical trigger to activate. To build more complex circuits, such as those formed by replacing transistors in traditional circuit designs with PCSSs requires that either each PCSS have its own trigger source, which greatly increases design complexity, or that the PCSS be triggered simultaneously if using the same trigger source, which reduces the number of usable circuit designs.

Additionally, if operating in the non-linear mode, there is no way to turn the circuit off without disconnecting the source, and doing that at high speeds (e.g. sub 1ns) is difficult with current technology.

SUMMARY OF THE INVENTION

The present invention overcomes the foregoing problems and other shortcomings, drawbacks, and challenges of high-speed switching or triggering of PCSS devices. This invention enables the use of PCSS as a replacement for transistors without requiring more than one optical trigger. This invention allows for the deliberate timing and activation of multiple PCSS from a single trigger source through the design and fine-tuning of optical path-lengths. This allows for picosecond timing precision, which was previously impossible for high-power electrical circuits. This invention may be used in the directed energy, pulsed power, medical, and high energy physics fields. It may also be used in electrical power conversion (AC/DC or DC/DC) and isolation.

While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention a method for triggering switches in a defined order comprises providing two or more PCSS devices and an optical trigger compatible with the PCSS devices; projecting a beam from the optical trigger; splitting the optical beam into two or more paths toward the two or more PCSS devices, wherein each of the two or more paths has a different length such that each of the two or more PCSS devices are triggered with defined time differentials.

The length of each of the two or more paths may be determined and defined with the speed of light from the optical trigger along the two or more paths.

The optical path consists of at least one of an optical fiber, a mirror arrangement, and a lens arrangement.

Splitting the optical beam consists of at least one of a partially-reflective mirror, reflection off a lens, fiber coupling to optical fibers, and a polarizing beam splitter.

The path lengths may be controlled and altered by one or more of employing different fiber lengths to each PCSS device, placing the PCSS on a translation stage, placing a reflective optic on a translation stage, and transmitting a beam through a solid having a higher index of refraction than other beam path(s).

The optical path length may be controlled by one or more of manufacturing a device with defined path lengths, whether via hard mounted PCSS/optics, or fixed length fibers; computer controlled translational stages for optics or PCSS, and/or manually controlled translational stages for optics or PCSS.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 1:
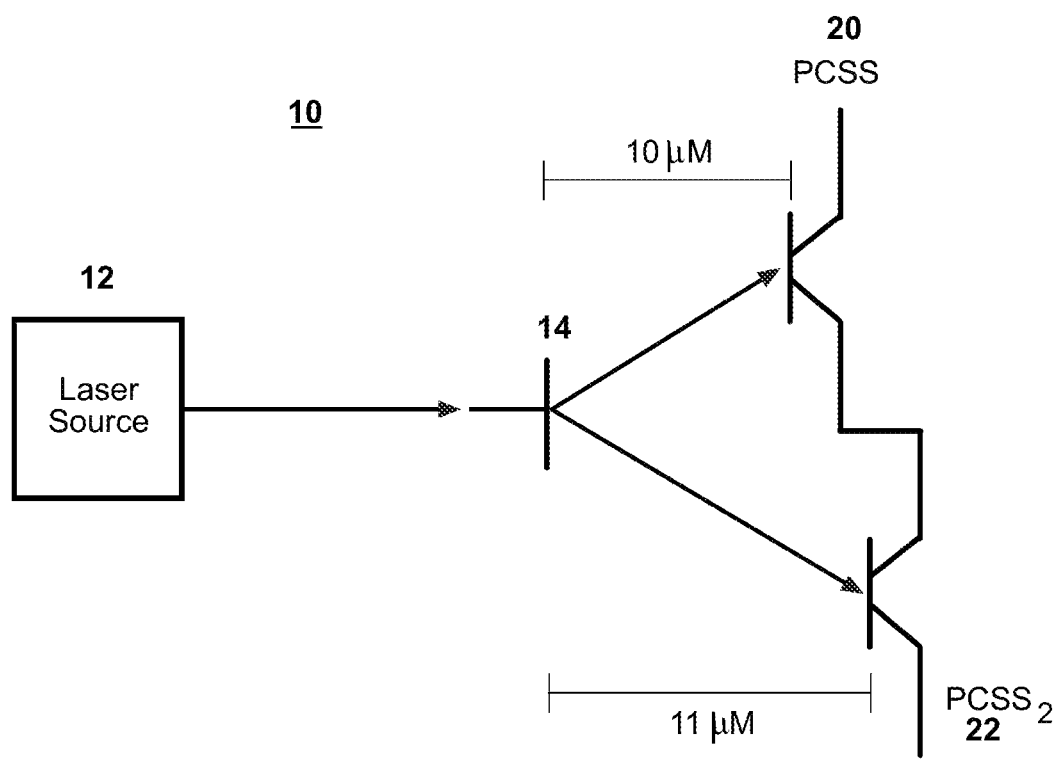
FIG. 1 illustrates differential switching of two photoconductive semiconductor switches (PCSS) based on different path lengths from the laser or optical source to the PCSSs.

As illustrated in FIG. 1, this invention 10 may use a single optical trigger source 12, e.g. laser, LED, or other suitable source, passed through either a beam splitter 14 or coupled into two different optical fibers 16, 18. By carefully selecting and determining the distance the light from the optical trigger source 12 travels, two or more PCSS devices 20, 22 may be triggered with picosecond precision in the time-domain. For example, if two PCSSs are triggered by the same optical trigger source, and the path to one of the switches, i.e. PCSS devices, is 100 mm longer than the other, that switch will trigger 330 ps after the first switch. The general equation is: $d = \Delta t \ast c$ where $\Delta t$ is the desired time delay, d is the path length difference, and c is the speed of light. Minimum time delay may be limited by the response time of PCSS, which typically have a 10-90 rise time, i.e. 10% to 90% of peak current, of ~150 ps.

This invention requires two or more PCSS devices 20, 22, an optical trigger 12 at the correct/suitable wavelength for the PCSSs chosen, and a method of splitting and directing the optical trigger to the PCSSs. It is important that the desired timing offset is defined and established from the first PCSS device triggered to each of the succeeding PCSS devices. Once that offset is known, it is necessary to determine the necessary optical path lengths to each PCSS device to ensure that the light from the optical trigger takes the desired longer time to reach the second device or subsequent devices. An example of a 1 micron path length difference (3.3 fs delay) is shown in FIG. 1. The difference is path lengths is more important than the overall path length. This optical path may be contained within a fiber, routed through mirrors and/or lenses in free space, or a combination of the two. A particular embodiment is presented in FIG. 1. However, the beam may be split and directed through multiple methods. The simplest is to use a beam splitter and physically offset the PCSS to obtain the desired time offset. However, it may also be done via differing fiber lengths or reflections from mirrors.

Figure 2:
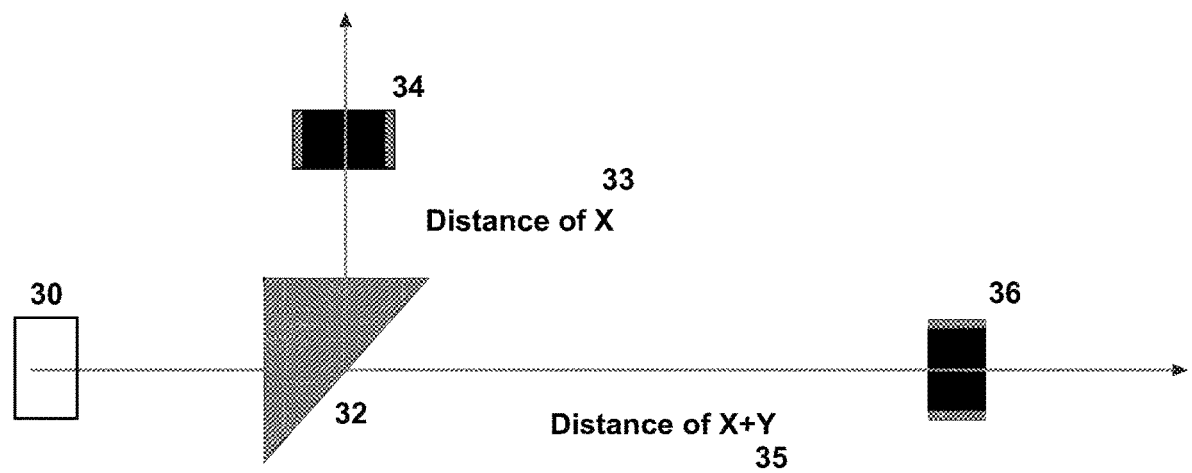
FIG. 2 illustrates differential switching of two photoconductive semiconductor switches (PCSS) based on different path lengths from the laser or optical source to the PCSSs, using a prism or beam splitter.

FIG. 2 illustrates the general principle of differing path lengths for the beam from the optical trigger source. Light from the optical trigger 30 is directed to a beam splitter 32 which sends a first beam toward a first PCSS device 34 and a second beam toward a second PCSS device 36. The delay or difference between the actuation of each PCSS device is determined by the difference in the beam path lengths 33, 35, which is distance Y.

Figure 3:
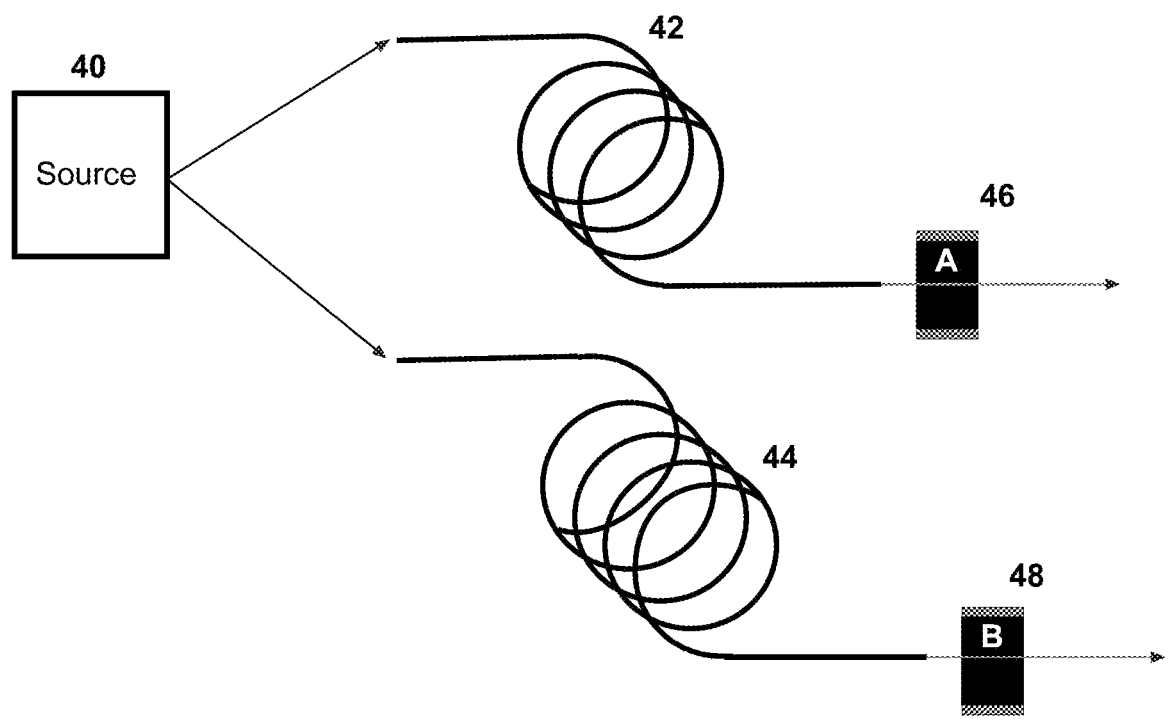
FIG. 3 illustrates differential switching of two photoconductive semiconductor switches (PCSS) based on different path lengths from the laser or optical source to the PCSSs using different lengths of optical fibers to define the path lengths.

FIG. 3 illustrates a distinct arrangement having an optical source or splitter 40 that is coupled to two optical fibers 42, 44 of differing lengths. In this case, the first optical fiber path 42 is slightly longer than the second optical fiber path 44. Accordingly, the first PCSS device 46 will be activated before the second PCSS device 48.

PCSS materials may include GaN, GaAs, SiC, AlN, and $Ga_2O_3$, as well as Si, C (diamond), and SiC. Contact materials may include any contact that has good adhesion to the chosen PCSS. Methods of beam splitting may include partially-reflective mirror(s), reflections from lens(es), fiber coupling to n # of fibers, and a polarizing beam splitter.

For example, if it is desired to trigger three PCSSs, two beam splitters may be needed. In this example, the primary beam is directed to the first beam splitter and is split in two. One of those two beams may then be directed to another beam splitter and split in two, creating a total of three beams.

The path lengths may be controlled and altered by a number of techniques, including employing different fiber lengths to each PCSS device, placing the PCSS on a translation stage, placing a reflective optic on a translation stage, and transmitting a beam through a solid having a higher index of refraction than other beam path(s). This last technique does not change the path length, but rather slows the light down.

Methods of controlling path length may include manufacturing a device with defined path lengths, whether via hardmounted PCSS/optics, or fixed length fibers; computer controlled translational stages for optics or PCSS, and/or manually controlled translational stages for optics or PCSS.

There are many uses for the invention, including high-voltage (>1200V) switching, high-amperage (>100 A) switching, ultra-fast (>1 MHz) switching, ultra-short pulse (<1 ns) switching, DC circuit protection, EMP/EMI generation, RF generation, particle beam generation, and transistor replacement.

The invention may be a replacement for spark gap and conventional transistor switches in high-voltage applications. When it is desired that the invention conduct current, a signal to turn on the optical source is sent. When the photons from the optical source impact the PCSS, the PCSS turns from an "off" state into a conductive "on" state. Depending on the mode of operation of the PCSS, it will either conduct electricity until the voltage supplied to it drops below a certain level, or it will stop conducting when the optical source is turned off. The use of optical path length differences allows for heretofore unseen precision in high-power switching.

Multiple wide bandgap semiconductors may be used for the PCSS in the invention, including but not limited to GaAs, GaN, and AlN. All of these materials exhibit both linear and non-linear modes of operation. A variety of optical sources may be used as long as they provide enough energy at the correct wavelength for a given material. GaAs is a suboptimal choice however, given it lacks durability compared to GaN or AlN.

This device may also be used to provide "hardening" to an electronic system, reducing its electromagnetic susceptibility when used in place of a traditional transistor.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method for triggering switches in a defined order comprises:
   providing two or more PCSS devices and an optical trigger compatible with the PCSS devices;
   projecting a beam from the optical trigger;
   splitting the optical beam into two or more paths toward the two or more PCSS devices, wherein each of the two or more paths has a different length such that each of the two or more PCSS devices are triggered with defined time differentials.

2. The method for triggering switches in a defined order of claim 1, defining length of each of the two or more paths with the speed of light from the optical trigger along the two or more paths.

3. The method for triggering switches in a defined order of claim 1, wherein the optical path consists of at least one of an optical fiber, a mirror arrangement, and a lens arrangement.

4. The method for triggering switches in a defined order of claim 1, wherein splitting the optical beam consists of at least one of a partially-reflective mirror, reflection off a lens, fiber coupling to optical fibers, and a polarizing beam splitter.

5. The method for triggering switches in a defined order of claim 1, wherein the path lengths are controlled and altered by one or more of employing different fiber lengths to each PCSS device, placing the PCSS on a translation stage, placing a reflective optic on a translation stage, and transmitting a beam through a solid having a higher index of refraction than other beam path(s).

6. The method for triggering switches in a defined order of claim 1, wherein optical path length is controlled by one or more of manufacturing a device with defined path lengths, whether via hard mounted PCSS/optics, or fixed length fibers; computer controlled translational stages for optics or PCSS, and/or manually controlled translational stages for optics or PCSS.

* * * * *